United States Patent [19]

Kwon et al.

[11] Patent Number: 5,195,018

[45] Date of Patent: Mar. 16, 1993

[54] HIGH DIELECTRIC CONSTANT CAPACITOR AND METHOD FOR MANUFACTURING THE SAME

[75] Inventors: Keewon Kwon; Youngwug Kim, both of Suwon, Rep. of Korea

[73] Assignee: Samsung Electronics Co., Ltd., Suwon, Rep. of Korea

[21] Appl. No.: 899,973

[22] Filed: Jun. 17, 1992

[30] Foreign Application Priority Data

Jul. 3, 1991 [KR] Rep. of Korea .................. 91-11272

[51] Int. Cl.$^5$ .................. H01G 7/00; H01G 9/00; H01G 4/06
[52] U.S. Cl. .................. 361/313; 29/25.42; 257/528
[58] Field of Search .................. 29/25.03, 25.42; 361/311, 312, 313, 529; 357/51

[56] References Cited

U.S. PATENT DOCUMENTS

| | | | |
|---|---|---|---|
| 4,437,139 | 3/1984 | Howard | 361/313 |
| 4,734,340 | 3/1988 | Saito et al. | 428/698 |
| 4,959,745 | 9/1990 | Suguro | 29/25.42 |
| 5,111,355 | 5/1992 | Anand et al. | 357/51 X |

OTHER PUBLICATIONS

M. Saitoh, T. Mori and H. Tamura; "Electrical Properties of THIN $Ta_2O_5$ Films Grown by Chemical Vapor Deposition"; 1986 IEEE, pp. 680–683, CH. 2381.

*Primary Examiner*—Donald A. Griffin
*Attorney, Agent, or Firm*—Robert A. Westerlund; Charles R. Donohoe

[57] ABSTRACT

A high dielectric constant film comprised of at least a first dual-film layer, which includes a first tantalum oxide film, and a first metal oxide film which is made of a metal oxide whose valence is smaller than that of tantalum, and whose dielectric constant is equal to or greater than that of tantalum oxide. The first metal oxide film preferably has a thickness of less than approximately 50 angstroms, in order to thereby avoid the formation of a columnar structure, which has been identified as a principal cause of the high leakage current problem which has plagued presently available high dielectric constant capacitors. The first tantalum oxide film preferably has a thickness in the range of between approximately 5 angstroms to approximately 200 angstroms, with the ratio of the thickness of the first tantalum oxide film to the thickness of the first metal oxide film being in the range of 1:10 to 100:1. The high dielectric constant film preferably further includes a plurality of additional dual-film layers formed on the first dual-film layer, to thereby provide a multilayer high dielectric constant film. Each of the additional dual-film layers is preferably of the same construction as that of the first dual-film layer.

The present invention also encompasses a high dielectric constant capacitor which incorporates the above-described high dielectric constant film, and a method for manufacturing the same.

30 Claims, 3 Drawing Sheets

HIGH DIELECTRIC CONSTANT CAPACITOR AND METHOD FOR MANUFACTURING THE SAME

BACKGROUND OF THE INVENTION

1. Field of the Invention

This invention relates generally to a high dielectric constant capacitor, and, more particularly, to a high dielectric constant capacitor which utilizes a multilayer dielectric film having improved dielectric properties. This invention also relates to a method for making such a high dielectric constant capacitor. It is presently contemplated that this invention may have particular utility in very large scale integrated circuits (VLSIs), such as semiconductor memory devices, e.g. RAMs.

2. Description of the Prior Art

VLSIs, such as semiconductor memory devices having a large memory capacity, utilize miniature capacitors which are required to have a high capacitance, despite their small area. In order to achieve the required high capacitance, dielectric films having a high dielectric constant, such as tantalum oxide ($Ta_2O_5$) films, have been used in such miniature capacitors.

Generally, such tantalum oxide dielectric films are formed by means of a low pressure chemical vapor deposition (LPCVD) technique. However, tantalum oxide dielectric films formed in such a manner exhibit oxygen deficiency, which results in capacitor performance problems, such as unacceptably high leakage current and unacceptably low dielectric breakdown voltage.

One approach which has been proposed to overcome the above-mentioned drawbacks with tantalum oxide dielectric films, is described in U.S. Pat. No. 4,734,340, issued to Saito et al., and, in an article entitled "Electrical Properties of Thin $Ta_2O_5$ Films Grown By Chemical Vapor Deposition", @ pp. 680–683 of the IEDM Technical Digest (1986), by Saito et al. In accordance with this approach, the dielectric film is made of a mixture of tantalum oxide and titanium oxide. However, this approach only partially solves the oxygen deficiency problem, because the ratio of Ti to Ta is limited to a range of from 0.1 to 4 atomic percent, due to the solubility limit of titanium.

Thus, there still exists a need for a high dielectric constant capacitor which more fully overcomes the above-described drawbacks of presently available high dielectric constant capacitors. The present invention fulfills this need, while also providing a miniature capacitor which has a higher dielectric constant than the presently available miniature capacitors.

SUMMARY OF THE INVENTION

The present invention encompasses a high dielectric constant film comprised of at least a first dual-film layer, which includes a first tantalum oxide film, and a first metal oxide film which is made of a metal oxide whose valence is smaller than that of tantalum, and whose dielectric constant is equal to or greater than that of tantalum oxide. The first metal oxide film preferably has a thickness of less than approximately 50 angstroms, in order to thereby avoid the formation of a columnar structure which has been identified as a principal cause of the high leakage current problem which has plagued presently available high dielectric constant capacitors. The first tantalum oxide film preferably has a thickness in the range of between approximately 5 angstroms to approximately 200 angstroms, with the ratio of the thickness of the first tantalum oxide film to the thickness of the first metal oxide film being in the range of 1:10 to 100:1. The high dielectric constant film preferably further includes a plurality of additional dual-film layers formed on the first dual-film layer, to thereby provide a multilayer high dielectric constant film. Each of the additional dual-film layers is preferably of the same construction as that of the first dual-film layer. Optionally, an additional single layer of tantalum oxide or metal oxide may be formed on an uppermost one of the dual-film layers.

The present invention also encompasses a high above-described high dielectric constant film, and a method for manufacturing the same.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which.

DETAILED DESCRIPTION OF THE INVENTION

With reference now to FIGS. 1A–1F, there can be seen a step-by-step illustration of a process for manufacturing a high dielectric constant capacitor C, in accordance with the present invention. Although it is presently contemplated that the capacitor C embodying the present invention will have particular utility in a semiconductor memory device, such as a DRAM, it should be immediately recognized that the present invention is not limited in its scope to any particular application or environment. Further, it should also be immediately recognized that the present invention is not limited in its scope to a capacitor of any particular type or form. For example, the capacitor of the present invention may conveniently be a plane, stacked, hollow-trench, cylindrical, trench, stacked-trench, or pin capacitor.

Figure 1A:
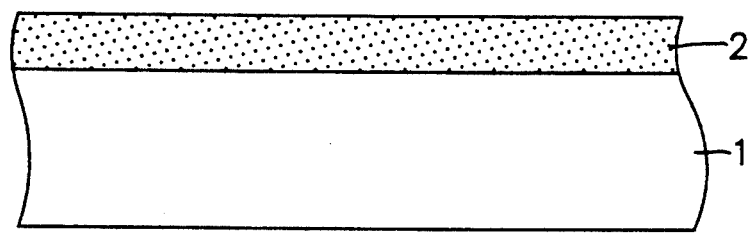
FIGS. 1A–1F are cross-sectional views depicting successive steps in a process for manufacturing a high dielectric constant capacitor embodying the present invention; and, FIGS. 2–6 are histograms depicting the relationship between deposition speed and deposition time for forming the component layers ($Ta_2O_5$ and $TiO_2$) of the high dielectric constant film of respective preferred embodiments of the high dielectric constant capacitor of the present invention.

Referring specifically now to FIG. 1A, the description of the process for manufacturing the capacitor C, in accordance with the present invention, in the process is to form a base film 2 on a silicon substrate 1. The base film 2 is preferably made of a conductive material which is selected from a group which includes doped polycrystalline silicon, in-situ doped polycrystalline silicon, amorphous silicon, and tungsten. The base film 2 serves as a first electrode of the capacitor C.

Figure 1B:
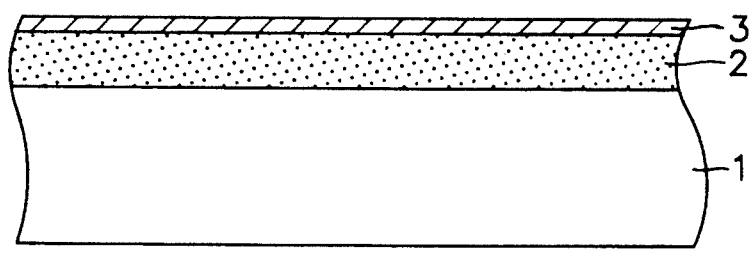

With reference to FIG. 1B, a tantalum oxide film 3 is then deposited on the base film 2, preferably, by means of a low pressure chemical vapor deposition (LPCVD) process. The tantalum oxide film 3 is preferably formed to a thickness of between approximately 5 angstroms to approximately 200 angstroms.

Figure 1C:
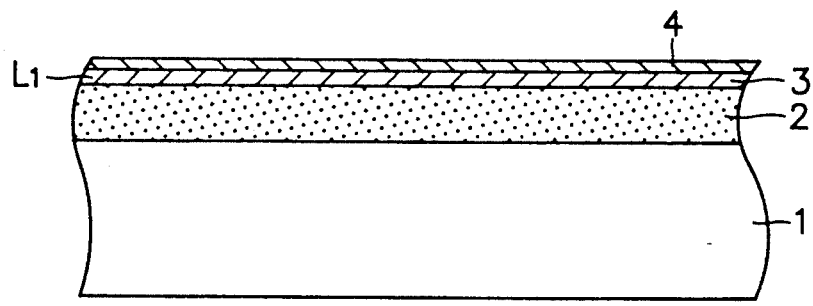

With reference to FIG. 1C, a metal oxide film 4 is then deposited on the tantalum oxide film 3, preferably, also by means of an LPCVD process. The metal oxide film 4 is preferably made of a metal oxide whose atomic valence is smaller than that of tantalum and whose dielectric constant is equal to or greater than that of tantalum oxide. Most preferably, the metal oxide is selected from a group which includes $TiO_2$, $SnO_2$, $ZrO_2$, $HfO_2$, $WO_2$, $Al_2O_2$, $Cr_2O_3$, $Y_2O_3$, $La_2O_3$, $Bi_2O_3$, $Th_2O_3$, PbO, BaO, SnO, SrO, CaO, MnO, and MgO. However, it should be clearly understood that this list of metal oxides is intended to be illustrative, and not exhaustive, and thus, is not limiting to the present invention. In the presently contemplated best mode of the present invention, the metal oxide film 4 is made of titanium oxide formed to a thickness of less than approximately 50 angstroms, in order to avoid forming a columnar structure. Further, the ratio of the thickness of the tantalum oxide film 3 to the thickness of the metal oxide film 4 is preferably in rne range of 1:10 to 100:1. The tantalum oxide film 3 and the metal oxide film 4 together comprise a first dual-film layer $L_1$.

Figure 1D:
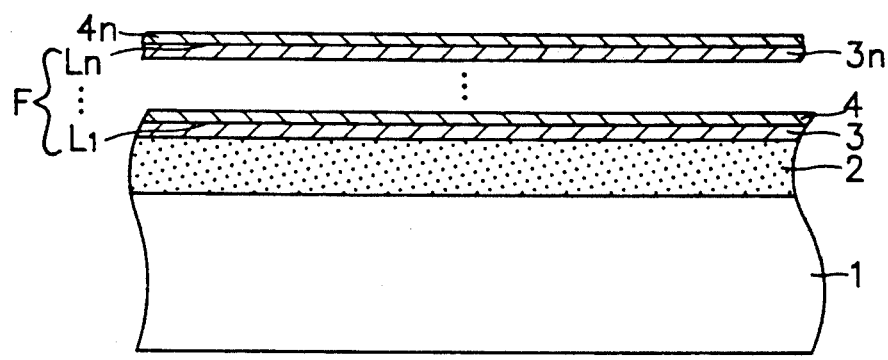
Figure 1E:
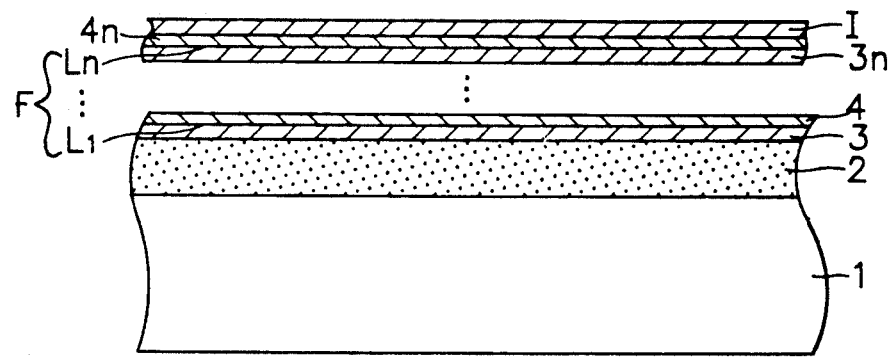

Preferably, as can be seen in FIGS. 1D and 1E, the steps of depositing the tantalum oxide film 3 and the metal oxide film 4 are sequentially repeated, a selected number of times, to thereby form a plurality of dual-film layers, $L_1$–$L_n$, each of which is comprised of a respective tantalum oxide film $3_i$ and a respective metal oxide film $4_i$, where i = 1 through n, and n is a positive integer equal to or greater than 2. An additional single layer I may be deposited on the nth dual-film layer $L_n$. The additional single layer I may be either a tantalum oxide film or a metal oxide film, such as titanium oxide film.

Collectively, the plurality n of dual-film layers, $L_1$–$L_n$, comprise the high dielectric constant film F of the capacitor C. The number n is selected to ensure that the overall thickness of the high dielectric constant film F is sufficient for the particular application for which the capacitor C is utilized, e.g., with respect to dielectric breakdown voltage, capacitance strength, and leakage current.

Figure 1F:
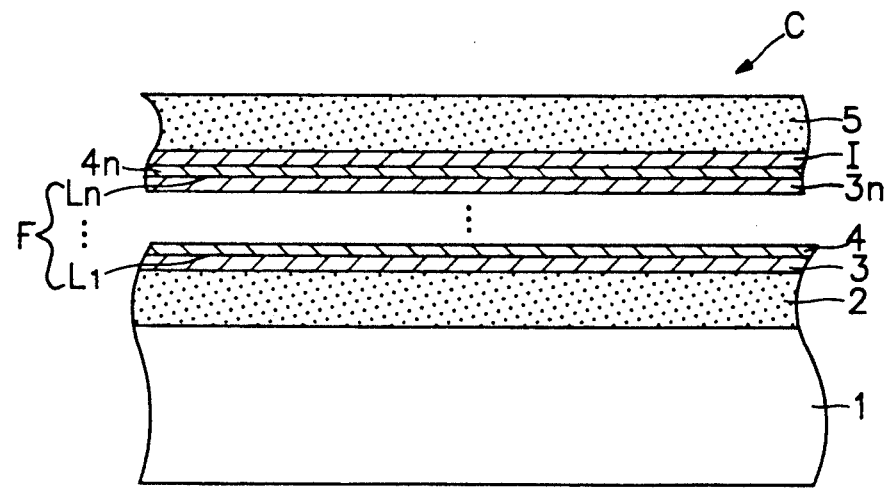

With reference to FIG. 1F, the final step in the process for making the capacitor C constitutes forming an upper film 5 on the uppermost layer, either I or $4_n$, of the multilayer, high dielectric constant film F. the upper film 5 is preferably made of the same conductive material as that of the base film 2. The upper film 5 serves as the second electrode of the capacitor C.

Optionally, a thermal treatment process may be carried out subsequent to the formation of the upper film 5, in order to relax any residual stress which may be present between any two or more of the multiple layers $3_i$, $4_i$, of the multilayer, high dielectric constant film F. However, since the layers $3_i$, $4_i$ are preferably deposited by a low pressure chemical vapor deposition (LPCVD) process, which is ordinarily carried out under conditions (such as high temperature) sufficient to ensure that the films $3_i$, $4_i$ are deposited evenly and uniformly, it is generally unnecessary to employ this optional thermal treatment process.

Although not limiting to the practice of the present invention, the above-described process of the present invention can be conveniently carried out with a metallorganic chemical vapor deposition (MOCVD) apparatus (not shown) connected to a suitable metallorganic supply (not shown).

With reference now to FIGS. 2-6, there can be seen histograms which depict the relationship between the deposition speed and deposition time for forming the individual tantalum oxide and titanium oxide ($TiO_2$) films, $3_i$, $4_i$, of each dual-film layer, $L_i$, of the high dielectric constant film F of respective preferred embodiments of the high dielectric constant capacitor C of the present invention.

Figure 2:
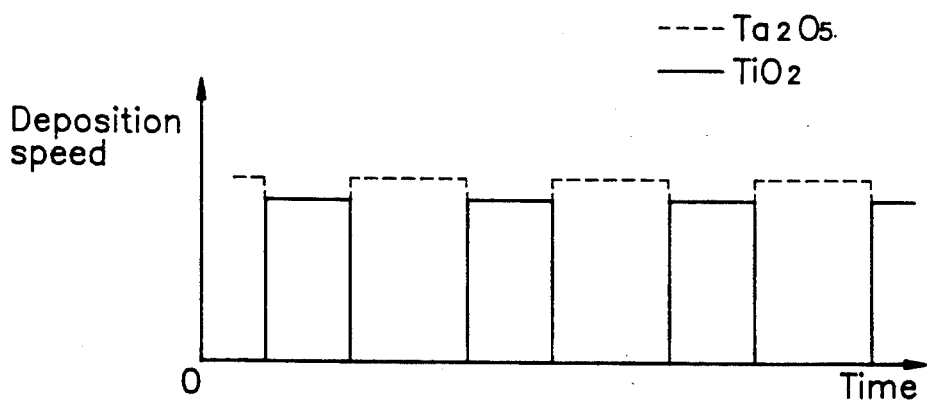

With particular reference now to FIG. 2, in a first preferred embodiment of the process of the present invention, the respective times for deposition of the tantalum oxide film $3_i$ and the titanium oxide film $4_i$ of each dual-film layer, $L_i$, do not overlap. In other words, the time at which deposition of each respective titanium oxide film $4_i$ begins does not overlap the time at which deposition of each respective tantalum oxide film $3_i$ ends, and vice versa. Rather, in accordance with this first preferred embodiment, the starting time for the deposition of each respective titanium oxide film $4_i$ is substantially concurrent with the ending time for the deposition of each respective tantalum oxide film $3_i$, and vice versa.

Figure 3:
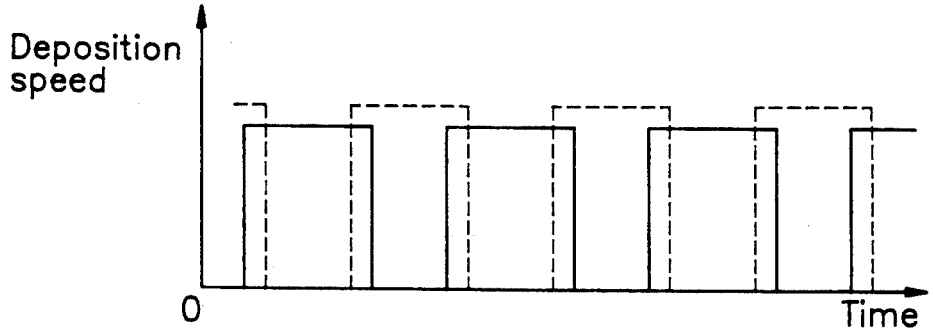

With reference to FIG. 3, in a second preferred embodiment of the process of the present invention, the respective times for deposition of the tantalum oxide film $3_i$ and the titanium oxide film $4_i$ of each dual-film layer, $L_i$, partially overlap. In other words, the deposition of each respective titanium oxide film $4_i$ begins at a predetermined time before the time at which deposition of each respective tantalum oxide film $3_i$ ends, and vice versa.

Figure 4:
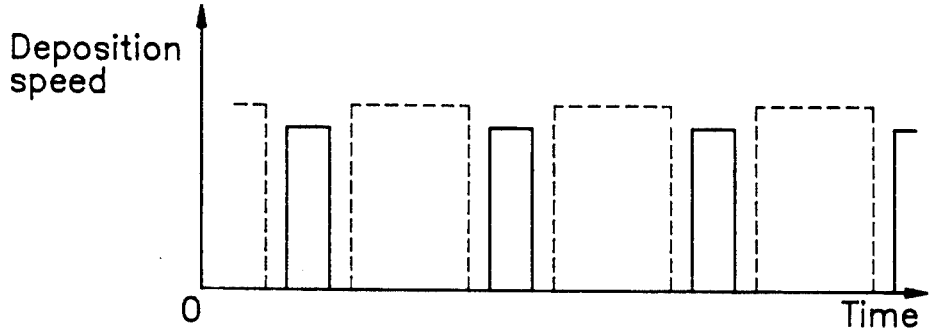

With reference to FIG. 4, in a third preferred embodiment of the process of the present invention, the starting time for the deposition of each respective titanium oxide film $4_i$ is separated by a predetermined time interval from the ending time for the deposition of each respective tantalum oxide film $3_i$, vice versa.

Figure 5:
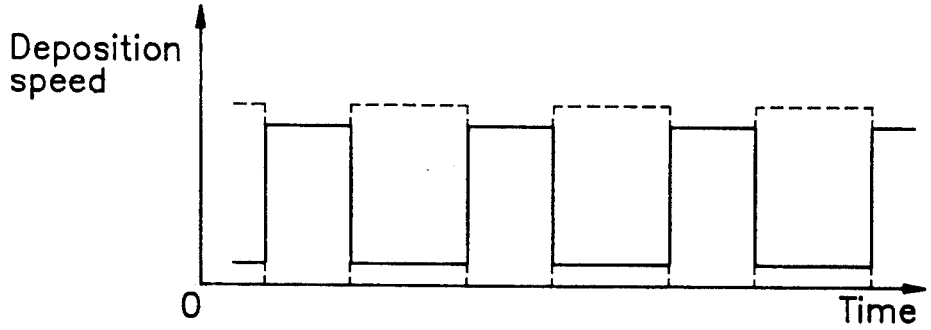

With reference to FIG. 5, in a fourth preferred embodiment of the process of the present invention, the deposition parameters are the same as in the first during the time periods when each respective tantalum oxide film $3_i$ is being deposited, titanium oxide is simultaneously deposited, but at a very low deposition speed, so that only minute quantities of the titanium oxide are deposited during deposition of each respective tantalum oxide film $3_i$.

Figure 6:
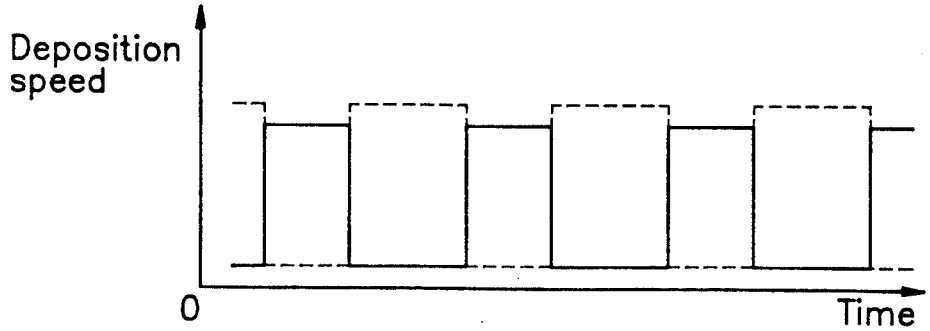

With reference to FIG. 6, in a fifth preferred embodiment of the process of the present invention, the deposition parameters are the same as in the fourth preferred embodiment depicted in FIG. 5, except that, additionally, during the time periods when each respective titanium oxide film $4_i$ is being deposited, tantalum oxide is simultaneously deposited, but at a very low deposition speed, so that only minute quantities of the tantalum oxide are deposited during deposition of the titanium oxide film $4_i$.

As will be appreciated by those skilled in the art, a high dielectric constant capacitor C constructed in accordance with any of the above-described embodiments of the present invention, overcomes the disadvantages of the presently available high dielectric constant capacitors, while simultaneously providing a high dielectric constant capacitor having a dielectric constant which is higher than that of the presently available high dielectric constant capacitors. More particularly, the provision of an ultra-thin metal oxide film 4 over the tantalum oxide film 3 of the dielectric film F, eliminates the prior art problem of unacceptably high leakage current, by avoiding a columnar dielectric film structure, which has been determined to be the principal cause of the aforesaid prior art problem. Further, the provision of multiple dual-film layers, $L_1$–$L_m$, increases the dielectric constant of the dielectric film F, relative to the prior art, and, also, minimizes the oxygen deficiency of the dielectric film F, thereby substantially increasing the dielectric breakdown voltage of the capacitor C, relative to the prior art. Moreover, the process of the present invention eliminates the lengthy thermal treatment process that is required with the prior art dielectric film deposition process, thereby increasing production speed and improving production efficiency, relative to the prior art.

Although several preferred embodiments of the present invention have been described in detail hereinabove, it should be clearly understood that many variations and/or modifications of the basic inventive concepts herein taught which may appear to those skilled in the pertinent art will still fall within the spirit and scope of the present invention, as defined in the appended claims.

What is claimed is:

1. A high dielectric constant capacitor, including:
    a substrate;
    a first electrode film formed on said substrate;
    a first tantalum oxide film formed on said first electrode film;
    a first metal oxide film formed on said first tantalum oxide film, wherein said first metal oxide film is made of a metal oxide whose valence is smaller than that of tantalum, and whose dielectric constant is equal to or greater than that of tantalum oxide;
    wherein said first tantalum oxide film and said first metal oxide film together comprise a high dielectric constant film; and
    a second electrode film formed on said high dielectric constant film.

2. The capacitor as set forth in claim 1, wherein said first tantalum oxide film has a thickness in the range of between approximately 5 angstroms to approximately 200 angstroms.

3. The capacitor as set forth in claim 1, wherein said first metal oxide film has a thickness of less than approximately 50 angstroms.

4. The capacitor as set forth in claim 3, wherein the ratio of the thickness of said first tantalum oxide film to the thickness of said first metal oxide film is in the range of 1:10 to 100:1.

5. The capacitor as set forth in claim 4, wherein said metal oxide is selected from a group comprised of $TiO_2$, $SnO_2$, $ZrO_2$, $HfO_2$, $WO_2$, $Al_2O_3$, $Cr_2O_3$, $Y_2O_3$, $La_2O_3$, $Bi_2O_3$, $Th_2O_3$, PbO, BaO, SnO, SrO, CaO, MnO, and MgO.

6. The capacitor as set forth in claim 1, wherein said high dielectric constant film further includes a plurality of additional dual-film layers formed on said first dual-film layer, wherein each of said additional dual-film layers is comprised of a respective tantalum oxide film and a respective metal oxide film.

7. The capacitor as set forth in claim 6, wherein said high dielectric constant film further includes an additional single layer of tantalum oxide formed on an uppermost one of said additional dual-film layers.

8. The capacitor as set forth in claim 6, wherein said high dielectric constant film further includes an additional single layer of metal oxide formed on an uppermost one of said additional dual-film layers.

9. The capacitor as set forth in claim 6, wherein said respective metal oxide film of each said additional dual-film layer is also made of said metal oxide.

10. The capacitor as set forth in claim 9, wherein said metal oxide is selected from a group comprised of $TiO_2$, $SnO_2$, $ZrO_2$, $HfO_2$, $WO_2$, $Al_2O_3$, $Cr_2O_3$, $Y_2O_3$, $La_2O_3$, $Bi_2O_3$, $Th_2O_3$, PbO, BaO, SnO, SrO, CaO, MnO, and MgO.

11. The capacitor as set forth in claim 10, wherein the ratio of the thickness of said respective tantalum oxide film of each said additional dual-film layer to the thickness of said respective metal oxide film of each said 1:10 to 100:1.

12. The capacitor as set forth in claim 11, wherein said respective tantalum oxide layer of each said additional dual-film layer has a thickness in the range of between approximately 5 angstroms to approximately 200 angstroms.

13. The capacitor as set forth in claim 12, wherein said respective metal oxide layer of each said additional dual-film layer has a thickness of less than approximately 50 angstroms.

14. A method for manufacturing a high dielectric constant capacitor, including the steps of:
    forming a first electrode film on a substrate;
    forming a first tantalum oxide film on said first electrode film;
    forming a first metal oxide film on said first tantalum oxide film, said metal oxide film being formed of a metal oxide whose valence is smaller than that of tantalum, and whose dielectric constant is equal to or greater than that of tantalum oxide, whereby said first tantalum oxide film and said first metal oxide film together comprise a high dielectric constant film; and,
    forming a second electrode film on said high dielectric constant film.

15. The method as set forth in claim 14, further including the steps of:
    forming an additional tantalum oxide film on said first metal oxide film; and,
    forming an additional metal oxide film on said additional tantalum oxide film.

16. The method as set forth in claim 14, further including the step of sequentially repeating said forming a tantalum oxide step and said forming a metal oxide film step, a plurality of times, to thereby form a plurality, n, of dual-film layers, each comprised of a respective tantalum oxide film and a respective metal oxide film;
    wherein said first tantalum oxide film and said first metal oxide film together comprise a first one of said n dual-film layers, and the last-formed tantalum oxide film and the last-formed metal oxide film together comprise an nth one of said n dual-film layers; and,
    wherein further, said n dual-film layers together comprise said high dielectric constant film.

17. The method as set forth in claim 16, wherein said tantalum oxide film of each of said n dual-film layers is formed to a thickness in the range of between approximately 5 angstroms to approximately 200 angstroms.

18. The method as set forth in claim 17, wherein said metal oxide film of each of said n dual-film layers is formed to a thickness of less than approximately 50 angstroms.

19. The method as set forth in claim 18, wherein the ratio of the thickness of said tantalum oxide film of each of said n dual-film layers to the thickness of said metal oxide film of each of said n dual-film layers, is in the range of 1:10 to 100:1.

20. The method as set forth in claim 19, wherein said metal oxide is selected from a group comprised of $TiO_2$, $SnO_2$, $ZrO_2$, $HfO_2$, $WO_2$, $Al_2O_3$, $Cr_2O_3$, $Y_2O_3$, $La_2O_3$, $Bi_2O_3$, $Th_2O_3$, PbO, BaO, SnO, SrO, CaO, MnO, and MgO.

21. The method as set forth in claim 20, further including the step of forming an additional said n dual-film layers.

22. The method as set forth in claim 20, further including the step of forming an additional single layer of said metal oxide on said nth one of said n dual-film layers.

23. The method as set forth in claim 19, wherein said step of forming a first tantalum oxide film, said step of forming a first metal oxide film, and said sequentially repeating step, are each vapor deposition process.

24. The method as set forth in claim 19, wherein said step of forming a first tantalum oxide film, said step of forming a first metal oxide film, and said sequentially repeating step, are carried out by means of a deposition process whereby the time at which deposition of said metal oxide film of each of said n dual-film layers begins, does not overlap the time at which deposition of its corresponding said tantalum oxide film ends, and vice versa.

25. The method as set forth in claim 24, wherein the starting time for deposition of said metal oxide film of each of said n dual-film layers, is substantially concurrent with the ending time for the deposition of its corresponding said tantalum oxide film, and vice versa.

26. The method as set forth in claim 24, wherein the starting time for deposition of said metal oxide film of each of said n dual-film layers, is separated by a predetermined time interval from the ending time for the deposition of its corresponding said tantalum oxide film, and vice versa.

27. The method as set forth in claim 19, wherein said step of forming a first tantalum oxide film, said step of forming a first metal oxide film, and said sequentially repeating step, are carried out by means of a deposition process whereby the time at which deposition of said metal oxide film of each of said n dual-film layers begins, partially overlaps the time at which deposition of its corresponding said tantalum oxide film ends, and vice versa.

28. The method as set forth in claim 19, where said step of forming a first tantalum oxide film, said step of forming a first metal oxide film, and said sequentially repeating step, are carried during deposition of said tantalum oxide film of each of said n dual-film layers, said metal oxide is simultaneously deposited, but at a very low deposition speed, so that only minute quantities of said metal oxide are deposited during deposition of said tantalum oxide film of each of said n dual-film layers.

29. The method as set forth in claim 28, wherein, additionally, during deposition of said metal oxide film of each of said n dual-film layers, said tantalum oxide is simultaneously deposited, but at a very low deposition speed, so that only minute quantities of said tantalum oxide are deposited during deposition of said metal oxide film of each of said n dual-film layers.

30. The method as set forth in claim 19, wherein said first electrode film and said second electrode film are made of a conductive material selected from a group comprised of doped polycrystalline silicon, amorphous silicon, and tungsten.

* * * * *

UNITED STATES PATENT AND TRADEMARK OFFICE
CERTIFICATE OF CORRECTION

PATENT NO.  : 5,195,018
DATED       : March 16, 1993
INVENTOR(S) : Keewon Kwon and Youngwug Kim It is certified that error appears in the above-identified patent and that said Letters Patent is hereby corrected as shown below:

Column 2, line 55, after "invention," and before "in", insert --will now proceed. More particularly, the initial step--.

Column 3, line 18, change "rne" to --the--.

Column 4, line 36, change "he" to --the--; and, after "first" and before "during", insert --preferred embodiment depicted in FIG. 2, except that--.

Column 6, line 9, after "said" and before "1:10", insert --additional dual-film layer, is in the range of--.

Column 6, line 44, after "oxide" and before "step", insert --film--.

Column 7, line 7, after "additional" and before "said", insert --single layer of tantalum oxide on said nth one of--.

Column 7, line 16, after "each" and before "vapor", insert --carried out by means of a low pressure chemical--.

UNITED STATES PATENT AND TRADEMARK OFFICE
CERTIFICATE OF CORRECTION

PATENT NO. : 5,195,018

DATED : March 16, 1993

INVENTOR(S) : Keewon Kwon and Youngwug Kim

It is certified that error appears in the above-identified patent and that said Letters Patent is hereby corrected as shown below:

Column 8, line 15, after "carried" and before "during", insert --out by means of a deposition process whereby--.

Signed and Sealed this

Twentieth Day of July, 1993

Attest:

MICHAEL K. KIRK

*Attesting Officer*     Acting Commissioner of Patents and Trademarks